United States Patent [19]
Kirk et al.

[11] Patent Number: 5,272,394
[45] Date of Patent: Dec. 21, 1993

[54] WIDE BANDWIDTH PEAK FOLLOWER CIRCUITRY

[75] Inventors: James W. Kirk, Westborough; Jeffrey B. Barrett, Bolton, both of Mass.

[73] Assignee: Digital Equipment Corporation, Maynard, Mass.

[21] Appl. No.: 925,904

[22] Filed: Aug. 6, 1992

Related U.S. Application Data

[63] Continuation of Ser. No. 544,229, Jun. 26, 1990, abandoned.

[51] Int. Cl.⁵ .................... H03K 5/153; G11C 27/02
[52] U.S. Cl. .................................. 307/351; 307/358; 328/116; 328/151
[58] Field of Search ............. 307/351, 353, 354, 358; 328/151, 115, 116

[56] References Cited

U.S. PATENT DOCUMENTS

| Re. 30,764 | 10/1981 | Muir et al. | 307/351 |
|---|---|---|---|
| 3,506,922 | 4/1970 | Hannauer, III et al. | 328/151 |
| 3,508,158 | 4/1970 | Marchese | 307/351 |
| 3,524,075 | 8/1970 | Matthews et al. | 307/351 |
| 3,701,909 | 10/1972 | Holmes et al. | 307/351 |
| 4,001,604 | 1/1977 | Parks et al. | 307/351 |
| 4,053,799 | 10/1977 | Minami | 307/351 |
| 4,311,960 | 1/1982 | Barr | 307/351 |
| 4,315,220 | 2/1982 | Firdeiser | 307/351 |
| 4,362,996 | 12/1982 | Priebe | 328/151 |
| 4,363,976 | 12/1982 | Minor | 307/351 |
| 4,518,921 | 5/1985 | Logan | 328/151 |
| 4,595,959 | 6/1986 | Bailey | 307/353 |
| 4,716,475 | 12/1987 | Dutcher | 360/45 |
| 4,724,496 | 2/1988 | White | 360/46 |
| 4,779,012 | 10/1988 | Moscovici | 307/353 |

FOREIGN PATENT DOCUMENTS

0012366 2/1978 Japan .................................. 307/351

OTHER PUBLICATIONS

D. J. Holcomb & T. Koczynski "Automatic, tracking, Peak timer" Mar. 1980 pp. 310-313. Rev. Sci. Instrum. vol. 51, No. 3.
J. M. Hynds et al "Auto Peak detector for use with pen plotters" pp. 25-26 Electronic Product Design, Mar. 1982.
"Precise and Wide-Band Peak Detector" pp. 9-10 IBM Technical Disclosure Bulletin vol. 31 No. 7 Dec. 1988.
Comlinear Corporation, Fast Sampling, Wideband Track and Hold Amplifier, Oct. (1988), 1989 Databook Solutions With Speed.
Comlinear Corporation, 1989 *Databook Solutions with Speed*, "Fast Sampling, Wideband Track and Hold Amplifier", pp. 5-3-5-9, Jan., 1989.

*Primary Examiner*—John Zazworsky
*Attorney, Agent, or Firm*—Fish & Richardson

[57] ABSTRACT

The magnitude of successive peaks in a time varying electrical signal are measured by applying the signal to magnitude circuitry capable of providing an output related to signal magnitude. The circuitry has a first state during which the output is dependent of changes in signal magnitude and a second state during which the output is substantially independent of such changes. The circuitry enters the first state during a first time interval within which a first peak is applied to the magnitude circuitry, and during a second time interval within which a second peak is applied to the magnitude circuitry. During a third time interval intermediate the first and second time intervals, the circuitry enters the second state. The magnitude circuitry's output during the second time interval is independent of its output during the third time interval so that successive outputs of the circuitry are related to the respective magnitudes of said successive peaks.

22 Claims, 4 Drawing Sheets

WIDE BANDWIDTH PEAK FOLLOWER CIRCUITRY

This is a continuation of application Ser. No. 07/544,229, filed Jun. 26, 1990, now abandoned.

BACKGROUND OF INVENTION

This invention relates to an apparatus for producing a DC electrical signal whose level is representative of the magnitude of the most recent peak of a time varying signal.

Peak detectors receive an AC input signal and, in response, provide a DC signal whose level is approximately equal to the amplitude of the AC input. Capacitive peak detectors apply the received AC input to a diode connected in series with a capacitor. When the AC input voltage exceeds the capacitor's voltage, the diode turns on to charge the capacitor up to the voltage of the AC input. Once the AC input reaches its peak and begins falling, the diode shuts off, preventing the capacitor from discharging downward with the AC input.

Since capacitors tend to discharge internally, the capacitor voltage slowly decays below the peak level. However, if the next peak arrives relatively soon, the capacitor voltage will not decay substantially before rising upward with the new peak. Accordingly, if the frequency of the input signal is high relative to the rate of the capacitor's discharge, the capacitor will provide a DC voltage whose level is approximately equal to the magnitude of the most recent peak of the AC input.

If the amplitude of a low peak of the AC input is less than the capacitor voltage, the diode will remain off and the capacitor voltage will not change in response to the arrival of the peak. Since the capacitive peak detector has no mechanism for changing the capacitor voltage downward to match the relatively low peak, the capacitor voltage level will not be representative of the relatively low peaks. Further, if the frequency of the AC input signal is low relative to the rate of the capacitor's discharge, the capacitor voltage may discharge substantially between peaks such that its level between peaks is not representative of the amplitude of the AC input signal.

SUMMARY OF THE INVENTION

In general, the invention features magnitude circuitry that provides an output related to the magnitude of successive peaks during successive time intervals within which those peaks are applied to the magnitude circuitry; the output is independent of changes in signal magnitude during a time interval intervening between those successive time intervals. Similarly, during the intervals within which the peaks are applied, the output is independent of the output during the intervening interval.

In preferred embodiments the magnitude circuitry includes a track and hold amplifier which tracks signal magnitudes during successive time intervals within which signal peaks are expected to rise and does not track signal magnitudes between those successive time intervals. Peak arrival time is forecast by comparing the signal to a delayed version of itself and watching for magnitude cross-overs; when the signal is decaying from a peak, its magnitude will be smaller than that of its delayed version, whereas as the signal rises toward a new peak, its magnitude will eventually cross-over to become larger than its delayed version. The delayed signal is the one actually applied to the track and hold amplifier to give time to make the comparison just discussed and to activate the amplifier to its tracking mode. The track and hold amplifier is returned to its non-tracking mode quickly after passage of each peak, so that the amplifier output will bear a known relationship to peak magnitude; to that end, the amplifier is kept in the tracking mode for a preset time interval, the start of which is adjusted so that the interval ends when the signal substantially equals its peak. To prevent below-peak signal fluctuations from falsely triggering the tracking mode, a threshold qualifier prevents triggering when the signal level is below the expected peak ranges.

The invention provides several advantages. For example, the peak detector provides an output voltage level which adjusts upward in response to a relatively high peak, and downward in response to a relatively low peak. Further, if electrical noise is superimposed on the signal, the output will rise with peaks which are artificially high due to positive noise and fall with peaks which are artificially low due to negative noise. Accordingly, the noise tends to average out over time.

Further, since the peak detector maintains its output at a constant level during the time interval between adjacent peaks, the output level is largely independent of whether the peaks of the input signal are close together or far apart in time.

Other features and advantages of the invention will be apparent from the following description of the preferred embodiment and from the claims.

DESCRIPTION OF THE PREFERRED EMBODIMENT

We first briefly describe the drawings.

Drawings

Figure 1:
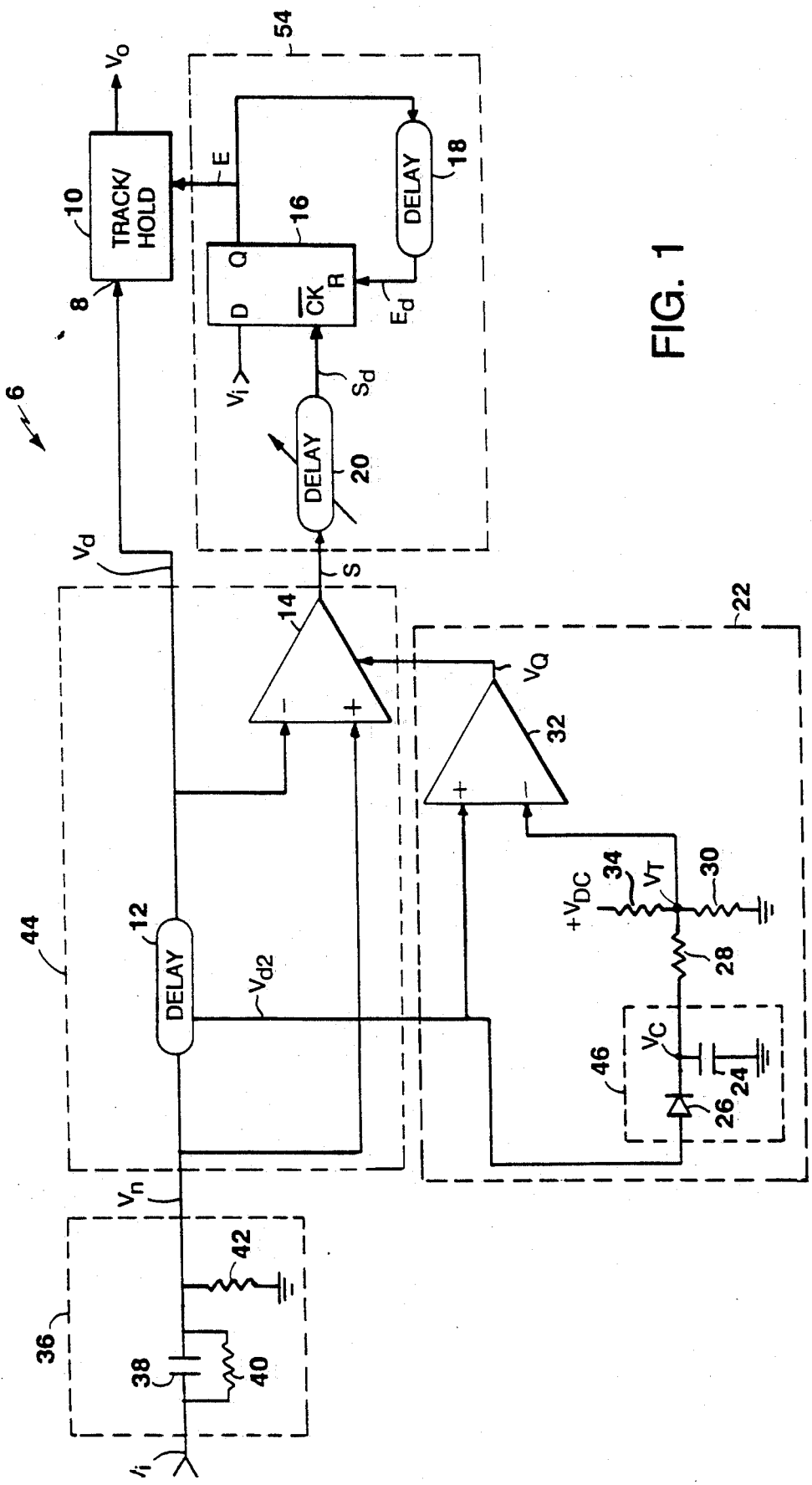
FIG. 1 is a schematic diagram of a peak follower circuit.

The peak follower circuit 6 depicted in FIG. 1 provides a DC output signal $V_o$ having a voltage level approximately equal to the most recent peak of an input signal $V_i$. The input signal $V_i$ is applied to an equalizer circuit 36 connected in series with a peak forecast circuitry 44 to produce a delayed form $V_d$ of input signal $V_i$. Delayed signal $V_d$ is then applied to input 8 of magnitude circuitry 10 (here, a track and hold amplifier).

Magnitude circuitry 10 has two states of operation. While in the first state (the tracking state), magnitude circuitry 10 adjusts its output signal $V_o$ to track changes in $V_d$. When magnitude circuitry 10 switches to the second state (the hold state) it latches $V_o$ at its current level and holds $V_o$ at that level regardless of changes in $V_d$. The state of magnitude circuitry 10 is determined by the logic level of track enable signal E generated by enable control circuitry (here, the combination of peak forecast circuitry 44 and duration control circuitry 54).

Figure 2:
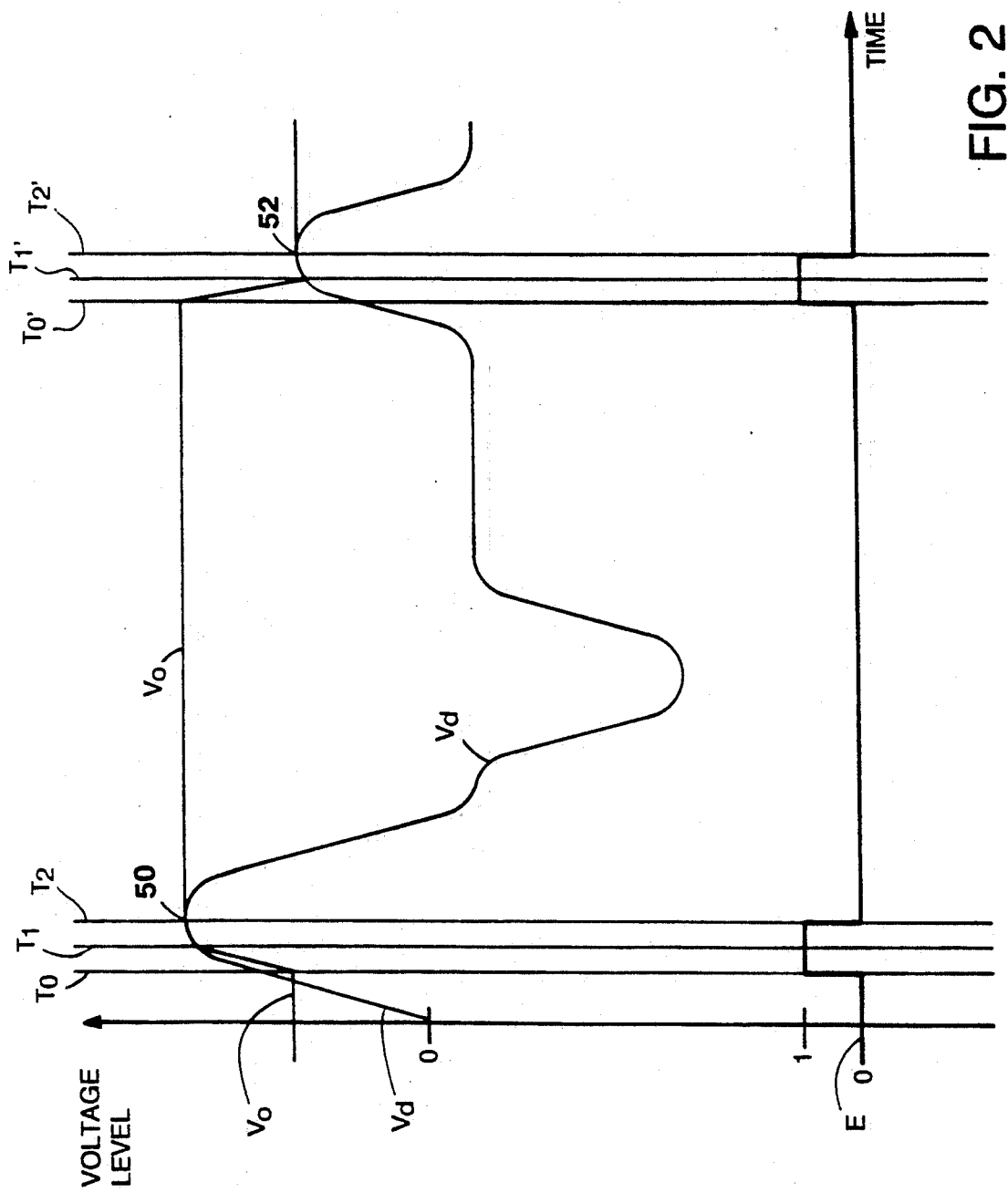
FIGS. 2-4 are timing diagrams illustrating the operation of the peak follower circuit of FIG. 1.

Referring to FIG. 2, at time $T_0$, slightly before $V_d$ reaches a peak 50, duration control circuitry 54 asserts enable signal E, thereby instructing magnitude circuitry 10 to enter the tracking state. Since, at time $T_0$, $V_d$ is greater than output signal $V_o$, magnitude circuitry 10 begins raising $V_o$ until it equals $V_d$ at time $T_1$. Once the two signals are equal, magnitude circuitry 10 continues to adjust $V_o$ to follow changes in $V_d$ for as long as enable signal E is asserted (i.e., for the duration of a first time interval).

Ideally, duration control circuitry removes enable signal E, thereby terminating the first time interval, at the time that $V_d$ reaches its peak (at time $T_2$); as described below, however, the duration of enable signal E is established by the time delay imposed by delay circuit 18. In response, magnitude circuitry 10 changes to the holding state thereby latching $V_o$ at time $T_2$. Thus, as $V_d$ drops away from its peak 50, $V_o$ remains constant at the same level as at time $T_2$.

At each subsequent peak of $V_d$, duration control circuitry 54 briefly asserts enable signal E to allow $V_o$ to adjust to the new peak level. For example, in the timing diagram of FIG. 2, the next peak 52 of $V_d$ is slightly lower than the previous peak 50. Accordingly, when enable signal E becomes active at time $T_0'$ (to initiate a second time interval), $V_o$ tracks downward to meet $V_d$ and follows $V_d$ until enable signal E is removed at time $T_2'$ (thereby terminating the second time interval). Thus, the output $V_o$ in the second time interval is independent of its magnitude while in the preceding holding state (i.e., a third time interval between times $T_2$ and $T_0'$).

If duration control circuitry 54 continues asserting track enable signal E after $V_o$ has reached the new peak level, $V_o$ will continue tracking $V_d$ downward to a level below the peak. Thus, enable signal E is ideally removed just as $V_o$ has reached the peak of $V_d$. However, since magnitude circuitry 10 requires a certain response time to change its output from an old peak level to a new peak level, tracking must be enabled prior to the arrival of the new peak to allow sufficient time for magnitude circuitry to adjust to the new level. This requires predicting when the peak will arrive. Toward this end, peak forecast circuitry 44 monitors a non-delayed form $V_n$ of input signal $V_i$ (non-delayed form $V_n$ is provided by equalizer circuitry 36 which will be explained below). Since $V_n$ leads its delayed form $V_d$, any peak of $V_d$ will first arrive at $V_n$. Thus, by detecting a peak on non-delayed form $V_n$, peak forecast circuitry 44 is able to forecast the arrival of a peak of $V_d$.

Forecast circuitry 44 includes delay line 12 for receiving $V_n$ and generating delayed form $V_d$. As illustrated in the timing diagram of FIG. 3, $V_n$ begins rising toward a peak at time $T_3$ and reaches the peak at time $T_4$. As $V_n$ falls from the peak, $V_d$ approaches $V_n$ until crossover time $T_5$ when the two signals become equal. This crossover indicates that $V_n$ has recently reached a peak which has yet to arrive on delayed form $V_d$.

Figure 3:
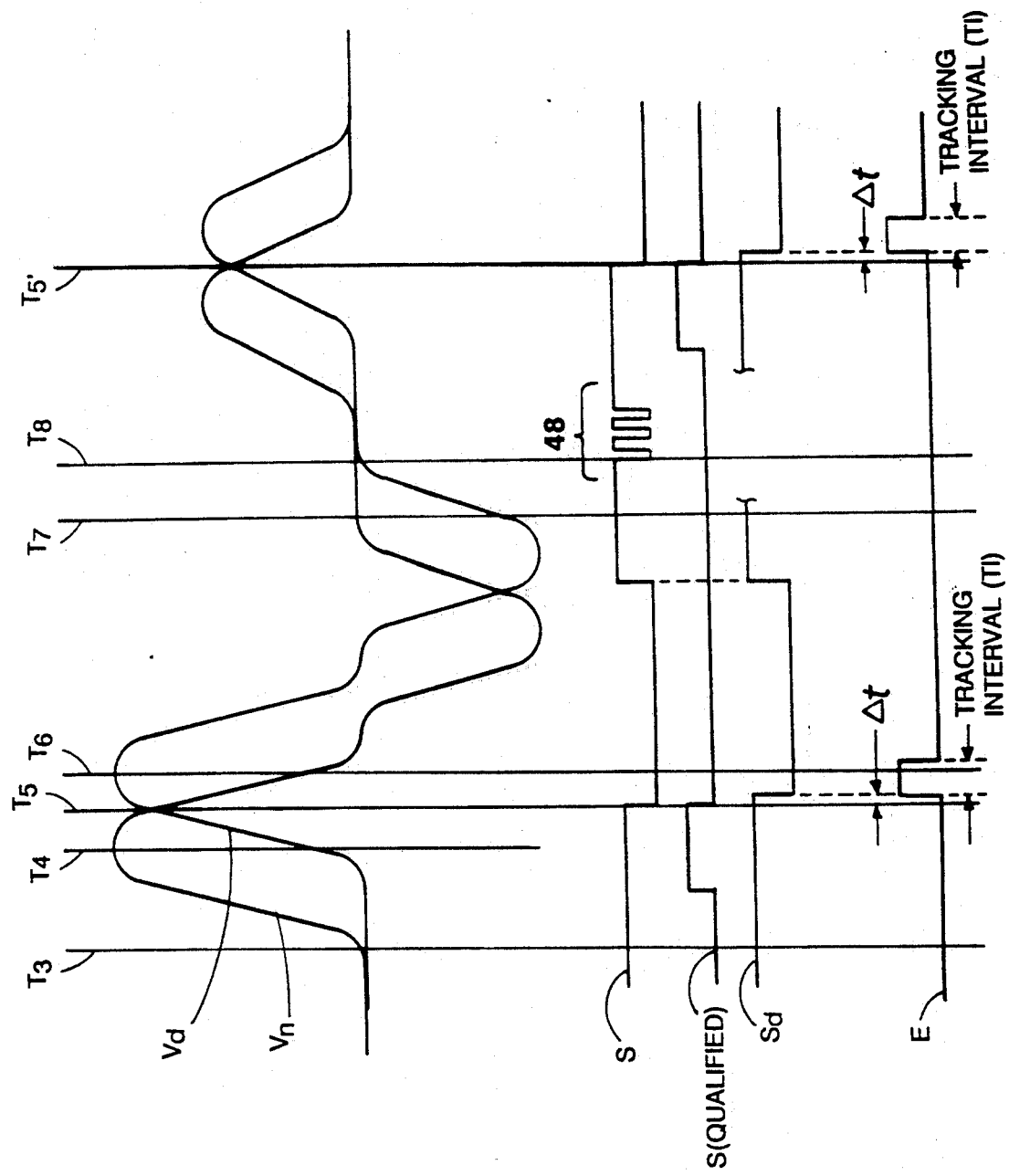

Peak forecast circuitry 44 further includes a comparator 14 to detect when a crossover has occurred. The delayed form $V_d$ is applied to the inverting input of comparator 14 and the non-delayed form $V_n$ is applied to its noninverting input. In response to these inputs, comparator 14 provides start signal S. As illustrated in FIG. 3, when $V_d$ crosses $V_n$ at time $T_5$, comparator 14 switches start signal S from a logic 1 level to a logic 0 level. Soon after this transition, $V_d$ reaches a peak at time $T_6$. The falling edge of start signal S thus forecasts the arrival of a peak on $V_d$.

"Start" signal S is applied to duration control circuitry 54. Shortly after receiving the falling edge of start signal S, duration control circuitry 54 asserts enable signal E for a preset tracking time interval TI. For reasons to be explained ahead, start signal S is first passed through delay line 20 to produce a deferred start signal $S_d$. $S_d$ is then applied to the clock input /CK of flip flop 16. On the falling edge of $S_d$, flip flop 16 changes its output Q to match a reference logic level $V_1$ (i.e., logic 1) applied to input terminal D. The flip flop output Q thereby asserts enable signal E to initiate the tracking interval TI. Tracking interval TI must be sufficiently long (e.g., 3 nsec) to allow magnitude circuitry 10 to adjust its output to a new level. To provide the desired 3 nsec tracking interval, enable signal E is passed through a 3 nsec delay line 18 whose output $E_d$ is connected to the reset input R of flip flop 16. The output $E_d$ of delay line 18 thus resets flip flop 16 to remove the enable signal E 3 nsec after it was asserted.

Ideally, the 3 nsec tracking time interval should terminate just as $V_o$ has reached a peak level (e.g., 50, 52). However, comparator 14 and flip flop 16 introduce delays which because of manufacturing variations cannot be precisely predicted. Since these variations operate to shift the tracking time interval, adjusting circuitry (here, a delay line 20) is manually adjusted by an operator to shift the 3 nsec tracking interval by an amount $\Delta t$ (FIG. 3). Ideally, $\Delta t$ shifts tracking interval TI such that the tracking interval terminates approximately when $V_o$ has risen to the peak level.

As explained above, input signal $V_i$ is applied to equalizer 36 to produce non-delay form $V_n$. Equalizer 36 compensates for distortion introduced by delay line 12. More specifically, delayed form $V_d$ generated by delay line 12 is slightly attenuated from the non-delayed form $V_n$. The degree of attenuation is greater for high frequency components of $V_n$ than for low frequency components. To compensate for this attenuation, capacitor 38 and resistors 40, 42 of equalizer 36 attenuate the low frequency components of the input signal $V_i$ to a greater degree than the high frequency components. Accordingly, the nondelayed form $V_n$ of the input signal $V_i$ provided by equalizer 36 is deliberately distorted such that the attenuation introduced by delay line 12 simply cancels that of the equalizer. As a result, the amplitude of $V_d$ is proportional to that of input signal $V_i$ regardless of $V_i$'s frequency.

Referring again to the timing diagram of FIG. 3, peak follower circuit 6 may be used in a disk/head tester device wherein input signal $V_i$ may remain at zero for a protracted period of time between pulses. For example, at time $T_7$ the non-delayed form $V_n$ of input signal $V_i$ reaches zero and remains at that level for a length of time which exceeds the delay of delay line 12. At time $T_8$, the zero level has propagated through delay line 12 so that the delayed form $V_d$ is also equal to zero. Since the inputs to comparator 14 are thus equal, slight noise on either input will trigger comparator 14 to change the level of start signal S thereby sending false triggers 48 to duration control circuitry 54.

To suppress false triggers 48, threshold qualifier circuitry 22 disables comparator 14 during periods when false triggers might occur. Threshold qualifier 22 includes envelope follower circuitry 46 which essentially functions as a diode 26 connected in series with a capacitor 24. A second delayed form $V_{d2}$ is applied to envelope follower circuitry 46 to rapidly charge capacitor 24 through diode 26. As shown in the timing diagram of FIG. 4, at time $T_9$, $V_{d2}$ rises above capacitor voltage $V_c$ thereby turning on diode 26. Capacitor 24 rapidly charges through diode 26 such that the capacitor voltage $V_c$ tracks $V_{d2}$. However, at time $T_{10}$, $V_{d2}$ reaches its peak and begins falling. Once $V_{d2}$ falls below capacitor voltage $V_c$, diode 26 shuts off and the capacitor begins discharging slowly through resistors 28, 30. The slow discharge rate causes capacitor 24 to remain near the peak voltage level of $V_{d2}$.

Resistors 28, 30 operate as a simple voltage divider to provide a voltage $V_T$ representing a fraction of the capacitor voltage $V_c$. Comparator 32 compares $V_T$ with $V_{d2}$ to determine when $V_{d2}$ rises above threshold $V_T$. At time $T_{11}$, $V_{d2}$ exceeds $V_T$, causing the output $V_Q$ of comparator 32 to switch positive (i.e., to logic one). At time $T_{12}$, $V_{d2}$ fall below $V_T$ causing $V_Q$ to return to a logic zero level.

Figure 4:
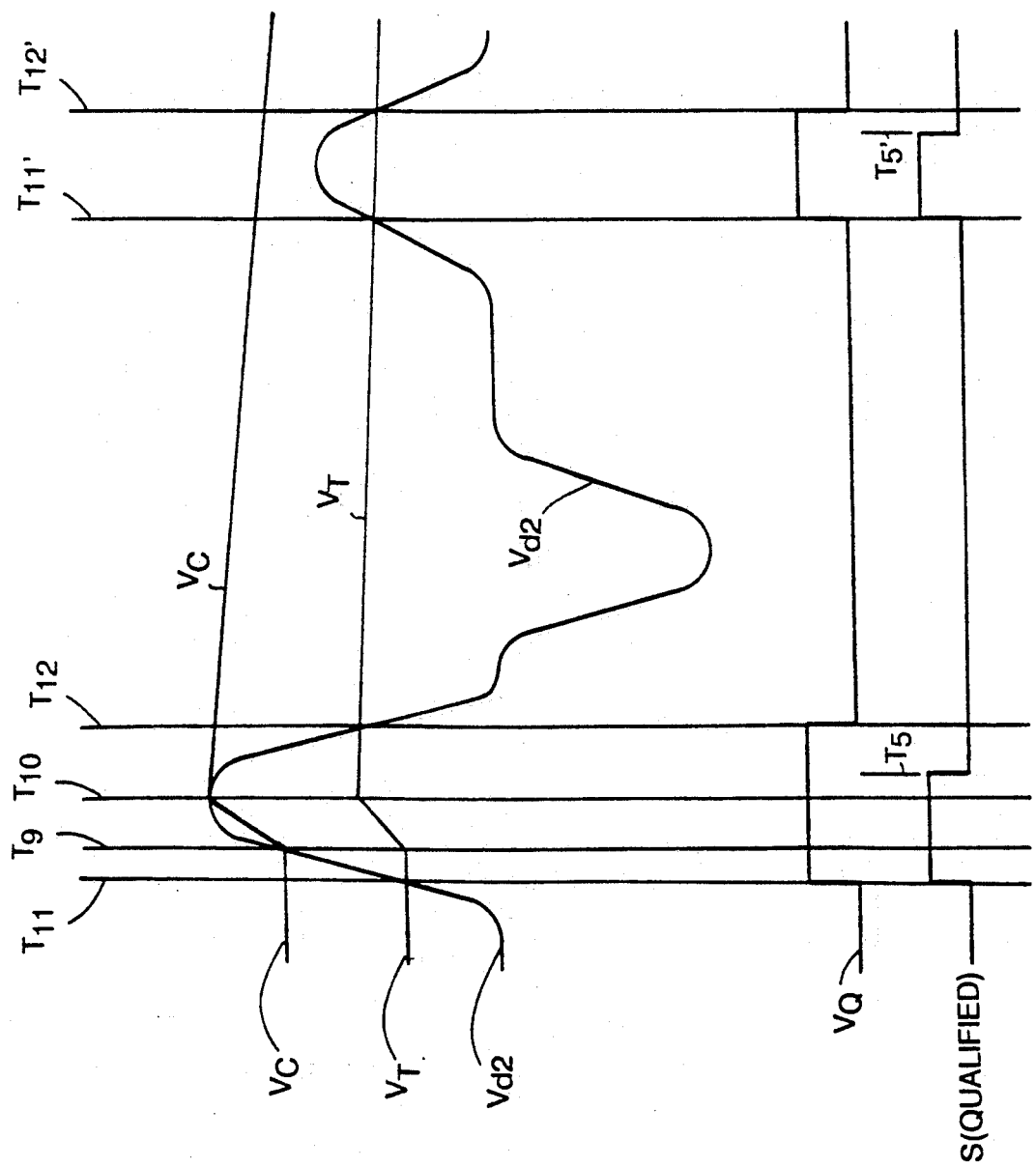

Output $V_Q$ is applied to an enable input of comparator 14 to disable comparator 14 while $V_Q$ is at a logic zero level. While comparator 14 is disabled, start signal S is held at zero, thereby preventing false triggers caused by noise. The timing of the start signal S as qualified by threshold qualifier 22 (herein the "qualified start signal") is shown in FIG. 4. The qualified start signal S switches to logic level one with the assertion of $V_Q$ (see times $T_{11}$, $T_{11}'$). However, qualified start signal S still falls to zero when $V_d$ crosses $V_n$ (see crossover times $T_5$ and $T_5'$).

Threshold voltage $V_T$ is chosen to be sufficiently high that noise pulses on $V_i$ which propagate to $V_{d2}$ will not exceed $V_T$ thereby enabling comparator 14 at an improper time. However, $V_T$ is not so high that low level signal peaks are effectively ignored. For example, $V_T$ may be chosen to be 25 to 50 percent of capacitor voltage $V_c$.

If input signal $V_i$ remains near zero for a sufficiently long period of time, capacitor 24 discharges through resistors 28.30, thereby lowering the threshold $V_T$. However, if $V_T$ were to fall to zero, comparator 32 would no longer disable comparator 14 while input $V_i$ is near zero. In this event, while $V_i$ was near zero, noise on its delayed form $V_{d2}$ would then trigger comparator 32 to assert $V_Q$ thereby intermittently enabling comparator 14. To prevent $V_T$ from falling to zero, pull-up resistor 34 is connected between the inverting input terminal of comparator 32 and a DC pull-up voltage signal $V_{DC}$. Resistors 34, 30 thus operate as a voltage divider to provide a minimum threshold voltage $V_T$ representing a fraction of the DC pull-up voltage $V_{DC}$.

It should be noted that the non-delayed form $V_n$ may be applied to envelope follower 46 in lieu of delayed signal $V_{d2}$. Since both signals have essentially the same peak voltage, envelope follower circuitry 46 will generate the same threshold level $V_T$ with either input. However, by using the delayed version $V_{d2}$, comparator 14 is not enabled until shortly after the nondelayed form $V_n$ has passed the threshold $V_T$. The enabling of comparator 14 can be further delayed by selecting a different tap of delay line 12 to be used in lieu of $V_{d2}$.

The above described threshold qualifier thus suppresses false triggers which might arise while input signal $V_i$ remains near level zero for a protracted period of time, as is common when the threshold qualifier is used in a disk head/tester device. However, peak follower circuit 6 may be used in other devices which may generate input signals $V_i$ which have plateaus at higher voltage levels (e.g., above $V_T$). Since a plateau at any level can cause the inputs of comparator 14 to be temporarily equal thereby generating false triggers, an alternative threshold qualifier may be used to disable comparator 14 during such high level plateaus. Like threshold qualifier 22, an alternative qualifier should effectively determine when the input signal has not varied for a significant period of time and then prevent this period from being mistaken as a peak by preventing enable signal E from being asserted.

The above described peak follower circuit 6 provides several advantages. For example, it generates an output signal whose level adjusts both upward and downward to match the magnitude of the most recently received peak. If a relatively low peak of input signal $V_i$ arrives after a relatively high peak, the magnitude circuitry will decrease its output to a level corresponding to the magnitude of the low peak. Further, if electrical noise is superimposed on the output signal, the output will follow peaks which are artificially high due to positive noise and peaks which are artificially low due to negative noise. Accordingly, the noise tends to average out over time.

Since the track and hold circuit maintains its output at a constant level during the time interval between adjacent peaks, the output level is largely independent of whether the peaks of the input signal are close together or far apart in time.

Other embodiments are within the following claims.

What is claimed is:

1. A method of measuring the magnitude of successive peaks in a time varying electrical signal, comprising the steps of generating a delayed input signal from said time varying electrical signal, applying delayed input signal to magnitude circuitry capable of providing an output related to a magnitude of said delayed input signal, said magnitude circuitry having a first state during which said output changes in response to changes in the magnitude of said delayed input signal when said magnitude is higher or lower than said output, and a second state in which said output is substantially independent of such changes, determining that a first peak of said delayed input signal is about to arrive at said magnitude circuitry by detecting that a first peak has occurred in said time varying signal, and responding thereto by setting said magnitude circuitry in said first state for a first time interval, determining that a second peak of said delayed input signal is about to arrive at said magnitude circuitry by detecting that a second peak has occurred in said time varying signal, and responding thereto by setting said magnitude circuitry in said first state for a second time interval, and setting said magnitude circuitry in said second state during a third time interval intermediate said first and second time intervals to maintain said output at substantially a magnitude of said first peak until said second time interval, whereby successive outputs of said magnitude circuitry are related to the respective magnitudes of said successive peaks regardless of the magnitudes of said peaks relative to each other.

2. The method of claim 1 wherein said magnitude circuitry comprises a track and hold amplifier which is enabled to track signal magnitude in said first state but not in said second state.

3. The method of claim 1 wherein said first and second time intervals each include time during which said delayed input signal is rising to its peak but substantially exclude time during which said delayed input signal is falling after its peak, so that said outputs will bear a known relationship to the respective magnitudes of said peaks.

4. The method of claim 1 further comprising the step of performing each of said determining steps by comparing the magnitude of said delayed input signal to a magnitude of said time varying electrical signal.

5. The method of claim 4 wherein said comparing step comprises determining a moment in time when the magnitude of said delayed input signal becomes greater than the magnitude of said time varying electrical signal.

6. The method of claim 4 wherein, to prevent selection of the state of said magnitude circuitry based on a comparison made while the magnitude of the time varying electrical signal is below a lowest expected peak magnitude, the comparison step is performed only when the magnitude of the non-delayed form of said signal has exceeded a threshold level.

7. The method of claim 4 further comprising the step of
determining when said signal has not varied substantially for a significant period of time, and
preventing said magnitude circuitry from entering said first state if said signal has not varied substantially for a significant period.

8. The method of claim 1 wherein each time interval during which said magnitude circuitry is in said first state has a preset duration.

9. The method of claim 8 further comprising the step of
allowing a start of each said time interval of preset duration during which said magnitude circuitry is in said first state to be adjusted so that said time interval of preset duration terminates when a delayed form of said signal substantially equals its peak.

10. The method of claim 8 wherein
said steps of setting of said magnitude circuitry in said first state each includes setting a flip flop circuit, passing an output of the flip flop through a delay circuit having a delay period approximately equal to said preset duration, and applying an output of said delay circuit to a reset input of said flip flop to terminate said first state 11. A peak follower circuit for measuring the magnitude of successive peaks in a time varying electrical signal comprising
delay circuitry for generating a delayed input signal from said time varying electrical signal,
magnitude circuitry for providing an output related to a magnitude of said delayed form of said signal, said magnitude circuitry having a first state during which said output changes in response to changes in the magnitude of said delayed input signal when said magnitude is higher or lower than said output, and a second state in which said output is substantially independent of such changes, and
enable control circuitry for
determining that a first peak of said delayed input signal is about to arrive at said magnitude circuitry by detecting that a first peak has occurred in said time varying signal, and responding thereto by setting said magnitude circuitry in said first state a first time interval
determining that a second peak of said delayed input signal is about to arrive at said magnitude circuitry by detecting that a second peak has occurred in said time varying signal, and responding thereto by setting said magnitude circuitry in said first state a second time interval, and
setting said magnitude circuitry in said second state during a third time interval intermediate said first and second time intervals to maintain said output at substantially a magnitude of said first peak until said second time interval, whereby successive outputs of said magnitude circuitry are related to the respective magnitudes of said successive peaks regardless of the magnitudes of said peaks relative to each other.

12. The peak follower circuit of claim 11 wherein said magnitude circuitry comprises a track and hold amplifier, said amplifier being enabled to track signal magnitude in said first state but not in said second state.

13. The peak follower circuit of claim 11 wherein said enable control circuitry defines said first and second time intervals to each include time during which said signal is rising to its peak but substantially exclude time during which said signal is falling after its peak, so that said outputs will bear a known relationship to the respective magnitudes of said peaks.

14. The peak follower circuit of claim 11 wherein
said enable control circuitry further comprises a comparator connected to an input of said delay circuitry and an output of said delay circuitry for comparing the magnitude of said delayed input signal to a magnitude of said time varying electrical signal, said enable control circuitry selecting the state of said magnitude circuitry based on said comparison.

15. The peak follower circuit of claim 14 wherein said comparator performs said comparing to determine a moment in time when the magnitude of the delayed input signal becomes greater than the magnitude of the time varying electrical signal.

16. The peak follower of claim 14 further comprising threshold qualifier circuitry, connected to said comparator, for enabling said comparator only when said time varying electrical signal has exceeded a threshold level to prevent said enable control circuitry from selecting a state of said magnitude circuitry based on a comparison made while the magnitude of the non-delayed form of the signal is below a lowest expected peak magnitude.

17. The peak follower of claim 14 further comprising qualifier circuitry for determining when said non-delayed form of said signal has not varied substantially for a significant period of time, and for providing a disable signal to said enable control circuitry in response to said determining.

18. The peak follower circuit of claim 11 wherein said enable control circuitry further comprises duration control circuitry for controlling each said time interval during which said magnitude circuitry is in said first state to have a preset duration.

19. The peak follower circuit of claim 18 wherein said duration control circuitry comprises circuitry for allowing a start of each said time interval of preset duration during which said magnitude circuitry is in said first state to be adjusted so that said time interval of preset duration terminates when a delayed form of said signal substantially equals its peak.

20. The peak follower circuit of claim 18 wherein
said duration control circuitry further comprises
a flip flop circuit having an output connected to said magnitude circuitry for causing said magnitude circuitry to be in said first state, and
a delay circuit having a delay period equal to said preset duration and being connected between a reset input of said flip flop and said output of said flip flop.

21. A peak follower circuit for measuring the magnitude of successive peaks in a time varying electrical signal comprising delay circuitry for generating a delayed input signal from said time varying electrical signal, magnitude circuitry, connected to said delay circuitry, for providing an output related to a magnitude of said delayed input signal, said magnitude circuitry having a first state during which said output changes in response to changes in the magnitude of said delayed input signal when said magnitude is higher or lower than said output, and a second state in which said output is substantially independent of such changes, and enable control circuitry for causing said magnitude circuitry to be in said first state during a first time interval within which a first peak of said delayed input signal is applied to said magnitude circuitry, and during a second time interval within which a second peak of said delayed input signal is applied to said magnitude circuitry, and for causing said magnitude circuitry to be in said second state during a third time interval intermediate said first and second time intervals, whereby successive outputs of said magnitude circuitry are related to the respective magnitudes of said successive peaks regardless of the magnitudes of said peaks relative to each other, said enable control circuitry comprising:

a comparator connected to an input of said delay circuitry and an output of said delay circuitry for comparing the magnitude of said delayed input signal to a magnitude of said time varying electrical signal to determine that a said peak of said delayed input signal is about to arrive at said magnitude circuitry, said enable control circuitry setting said magnitude circuitry to said first state based on said comparison.

22. A peak follower circuit for measuring the magnitude of successive peaks in a time varying electrical signal comprising a first delay circuit for generating a delayed input signal from said time varying electrical signal, magnitude circuitry, connected to said first delay circuit, for providing an output related to a magnitude said delayed input signal, said magnitude circuitry having a first state during which said output changes in response to changes in the magnitude of said delayed input signal when said magnitude is higher or lower than said output, and a second state in which said output is substantially independent of such changes, enable control circuitry for causing said magnitude circuitry to be in said first state during a first time interval within which a first peak of said delayed input signal is applied to said magnitude circuitry, and during a second time interval within which a second peak of said delayed input signal is applied to said magnitude circuitry, and for causing said magnitude circuitry to be in said second state during a third time interval intermediate said first and second time intervals, whereby successive outputs of said magnitude circuitry are related to the respective magnitudes of said successive peaks regardless of the magnitudes of said peaks relative to each other, said enable control circuitry comprising a comparator connected to an input of said first delay circuit and an output of said first delay circuit for comparing the magnitude of said delayed input signal to a magnitude of said time varying electrical signal, and for providing a start signal when the magnitude of said delayed signal is greater than the magnitude of said time varying electrical signal, an adjusting circuit, connected to said comparator, for providing a delayed start signal from said start signal, a flip flop circuit having an input connected to said adjusting circuit, and having an output connected to said magnitude circuitry, said flip flop causing said magnitude circuitry to enter the first state in response to said delayed start signal, a second delay circuit having a delay period of preset duration, connected between a reset input of said flip flop and said output of said flip flop, to reset said flip flop and cause said magnitude circuitry to enter said second state, and threshold qualifier circuitry, connected to said comparator for enabling the comparator only when said time varying electrical signal has exceeded a threshold level to prevent said enable control circuitry from selecting a state of said magnitude circuitry based on a comparison made while the magnitude of the time varying electrical signal is below a lowest expected peak magnitude.

* * * * *